United States Patent [19]

Anderson

[11] 4,138,650
[45] Feb. 6, 1979

[54] PHASE LOCK LOOP

[76] Inventor: Scott K. Anderson, 872 E. 400 North, Orem, Utah 84057

[21] Appl. No.: 779,609

[22] Filed: Mar. 21, 1977

Related U.S. Application Data

[60] Division of Ser. No. 595,100, Jul. 11, 1975, Pat. No. 4,013,840, and a continuation-in-part of Ser. No. 253,265, May 15, 1972, abandoned, and a continuation-in-part of Ser. No. 492,397, Jul. 29, 1974, abandoned, and a continuation-in-part of Ser. No. 601,363, Aug. 4, 1975, Pat. No. 4,020,289.

[51] Int. Cl.$^2$ .............................................. H03B 3/04
[52] U.S. Cl. ...................................... 331/1 A; 331/25
[58] Field of Search ........................... 331/1 A, 18, 25; 325/144, 184; 179/15 FD

[56] References Cited

U.S. PATENT DOCUMENTS

| 3,259,851 | 7/1966 | Brauer | 331/1 A X |
| 3,988,696 | 10/1976 | Sharpe | 331/1 A |

*Primary Examiner*—Siegfried H. Grimm

[57] ABSTRACT

A phase lock circuit has a voltage tuned oscillator (VTO) which is tuned by a tuning circuit. The tuning circuit supplies tune-up and tune-down (in frequency) signals to phase lock the VTO with respect to a reference signal. The tuning circuit supplies the tune-up and tune-down signals based on the results of samples of the VTO output from a variable modulus counter (VMC) with respect to a reference signal. The reference signal and VMC are reset to a time reference by a reset generator during coarse tuning or phase locking.

3 Claims, 2 Drawing Figures

PHASE LOCK LOOP

RELATED APPLICATIONS

This application is a divisional of U.S. Patent Application Ser. No. 595,100, filed July 11, 1975 for a TDM AND FDM TELEPHONE COMMUNICATION SYSTEM which is now U.S. Pat. No. 4,013,840. This application is also a continuation-in-part of U.S. Patent Application Ser. No. 253,265, filed May 15, 1972, now abandoned; and Ser. No. 492,397, filed July 29, 1974 and now abandoned. This application is also a continuation-in-part of U.S. Patent Application Ser. No. 601,363, filed Aug. 4, 1975, which is now U.S. Pat. No. 4,020,289. The disclosures of all these applications are hereby incorporated by reference as if fully set forth herein.

BACKGROUND OF THE INVENTION

Field

This invention relates to circuits for use in locking a signal in phase with respect to a reference signal.

STATE OF THE ART

In many signal processing/generating systems, those skilled in the art will recognize that it is desirable to lock a particular signal in phase with respect to a reference signal. This is particularly desirable in frequency multiplexing schemes of the type described and disclosed in the parent application hereto, Ser. No. 595,100, filed July 11, 1975, now U.S. Pat. No. 4,013,840, and in the related application Ser. No. 601,363, filed Aug. 4, 1975 and now U.S. Pat. No. 4,020,289.

A variety of phase locking circuits are known which operate to lock the output signal of a device such as a carrier generator in phase with a reference. However, such circuits inherently have proven to be cumbersome and typically expensive when applied to circuits in which the carrier frequency or the signal to be phase locked is variable or varies within a wide range of frequencies as in, for example, a wide range transmitter.

SUMMARY OF THE INVENTION

A phase lock circuit has a voltage tuned oscillator (VTO) which supplies an output to a variable modulus counter (VMC). A reference window generator receives a reference signal input through a reference divider. The reference window generator generates a timed reference window signal and supplies it to a position detector which also receives an output from the VMC. The frequency of the VTO output is an approximate product of the frequency of the reference signal times an integer. The frequency of the VMC output is the quotient of the VTO output divided by that integer.

The position detector compares the VMC output for time occurrence with respect to the window to supply a reset signal to a reset generator which is connected to cause the VMC and the reference divider to reset and start sending their signals approximately simultaneously.

The VMC and reference divider also supply signals to a tuning circuit which compares the arrival times of the signals from the VMC and reference divider. The tuning circuit supplies a tuning signal to the VTO to tune-up or tune-down in frequency to bring the VTO output and in turn the VMC output in frequency and in phase with the reference signal frequency received by the reference divider.

BRIEF DESCRIPTION OF THE DRAWINGS

In the drawings, which illustrate what is presently regarded as the best mode for carrying out the invention.

DESCRIPTION OF THE ILLUSTRATED EMBODIMENT

The phase lock circuit of the instant invention may be used to phase lock any signal with respect to a reference signal. Phase locking, as hereinafter described, is effected in a carrier generator circuit using a voltage tuned oscillator (VTO). However, those skilled in the art will recognize that the VTO may be any tuneable device or circuit in which it is desired to lock the output thereof in phase with a reference frequency.

Figure 1:
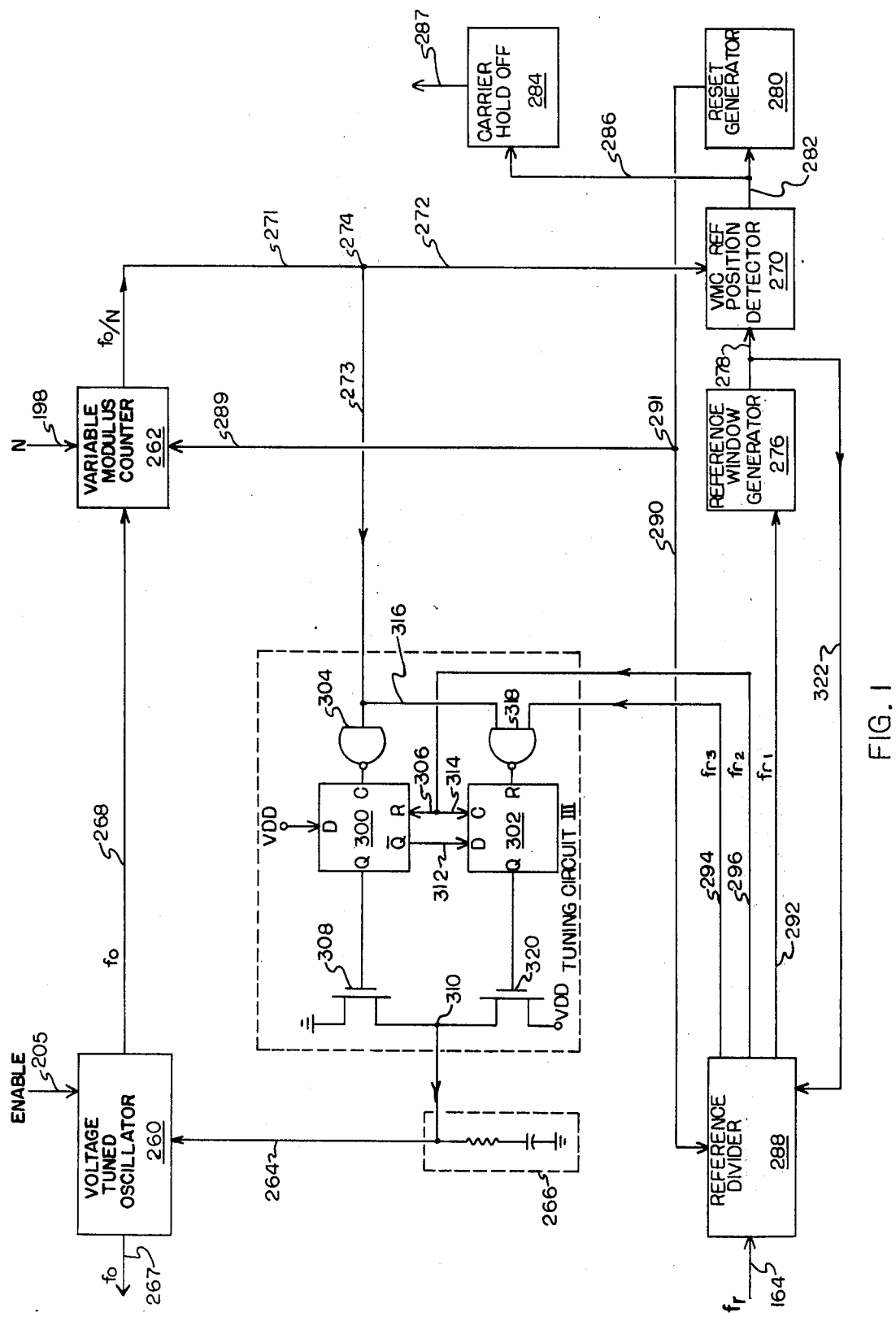
FIG. 1 is a simplified block diagram of a carrier generator.

Referring now to FIG. 1, a schematic of the carrier generator circuit is shown. The carrier generator includes a voltage tuned oscillator (VTO) 260, a variable modulus counter (VMC) 262. The VTO 260 receives a tuning signal via conductor 264 and filter 266 from the Tuning Circuit III. The VTO 260 also receives an enable signal tuning it on from an external source via conductor 205. The VTO 260 supplies its carrier output (fo) to a modulator circuit (not shown) via conductor 267, and to the VMC 262 via conductor 268. The VMC receives an input from an external source via conductor 198. The input may be regareded as an integer number (N). The VMC 262 divides the carrier (fo) by the integer N and supplies the quotient to the tuning circuit III and the VMC reference signal position detector 270 via conductors 271, 272, 273 and node 274 as illustrated. The position detector 270 receives reference window signal pulses from the reference window generator 276 via conductor 278. The detector 270 compares the VMC output pulses with the reference window pulses to determine whether or not the VMC pulses occur within the reference window pulses. If the VMC pulse does not occur within the window pulse, the detector 270 sends an output signal to the reset generator 280 via conductor 282 and to the carrier hold-off circuit 284 via conductor 286. Upon receipt, the hold-off circuit 284 interrupts the carrier output (not shown) via conductor 287 so that non-phase locked carrier will not be transmitted. System noise and cross-talk are thereby reduced.

The reset generator 280, upon receipt of the output signal of the detector 270, generates a reset signal and supplies it to the VMC 262 and reference divider 288 via conductors 289, 290 and node 291. The reference divider 288 also receives an input signal from a crystal oscillator (not shown) via conductor 164. The reference divider divides the input signal and supplies a first reference frequency signal (16 KHZ) to the window generator 276 over conductor 292. The reference divider also supplies a second reference signal and a third reference signal to the tuning circuit III via conductors 294, 296.

The tuning circuit III as here illustrated, includes a first flip flop 300 and a second flip flop 302. Both flip flops 300, 302 are edge triggered D-type units. The first flip flop 300 receives VMC output pulses via conductor 273 and gate 304. It also receives control voltage (VDD) from a power supply (not shown) and a reference signal via conductors 296 and 306. The first flip flop output is connected to the transistor (a MOSFET) 308. The transistor 308 supplies a direct current voltage tuning signal (tune-up) to the VTO through node 310 and filter 266. The first flip flop 300 also supplies an enable signal to the second flip flop 302 via conductor 312.

The second flip flop 302 receives a reference signal from the reference divider 288 via conductors 296 and 314. VMC output pulses are received via conductors 273 and 316 via gate 318. Reference pulses from the reference divider are also received via conductor 294 and gate 318. The output of the second flip flop 302 is supplied to transistor 320 which in turn supplies a tune down signal to the VTO via node 310.

In operation, the carrier generator circuit of FIG. 1 provides for carrier frequency tuning as well as phase and frequency locking. Carrier frequency tuning is effected by setting an integer N into the VMC 262. Assuming the VTO 260 is generating an output fo, the tuning circuitry described divides the fo by the integer N and compares it with fr, the reference frequency. If the quotient fo/N is different from fr, the circuitry will cause the VTO 260 to be tuned up or down as necessary until fo reaches a value so that the quotient fo/N will be equal to fr. In this way the VTO output fo is the product of fr times N.

Figure 2:
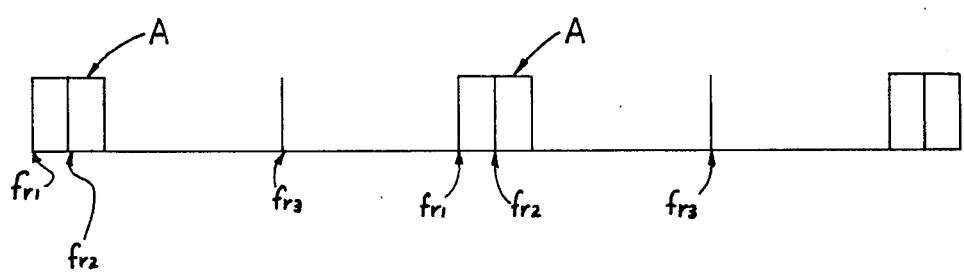
FIG. 2 is a pulse chart illustrating the generation of window pulses for frequency locking.

Frequency locking is effected by comparing VMC output pulses with reference window pulses. The reference window generator 276 generates short pulses at the frequency rate of the output fr of the reference divider 288. As shown in FIG. 2, the short pulses A (about 4 microseconds duration) are square wave pulses. If the detector 270 does not detect or see the existence of a VMC pulse during the period of the short window pulse, it causes the reset generator 280 to send reset signals at the end of the window pulse A. Hence the pulses of FIG. 2 are regarded as window pulses. The reset signal causes the reference generator 288 and VMC 262 to start their next cycles simultaneously or nearly so. Actually, the VMC 262 is started about 2 microseconds after the reference generator 288 so that in the event tuning is accurate, the next VMC pulse should be seen about in the middle of the window pulse A.

The tuning circuit III practically tunes the VTO 260 to effect both frequency and phase lock between fo and fr. The tuning is effected by comparing in time a second reference signal $fr_2$, a third reference signal $fr_3$ and the VMC output pulse. It should be noted that reference pulses $fr_1$, $fr_2$ and $fr_3$ are all identical in frequency but occur at different times as shown in FIG. 2.

When a VMC pulse is received by the tune down flip flop 300, the flip flop 300 goes high constituting a tune down signal to the VTO 260. Upon receipt of the second reference pulse $fr_2$, the flip flop 300 resets and goes low ending the tune-down pulse. Thus, if the VMC pulse arrives early (before $fr_2$) the tuning circuit III recognizes that the VMC pulse is higher in frequency than it should be and directs the VTO 260 and in turn fo to tune down to a lower frequency.

When no VMC pulse has been received by the tuning circuit III when reference pulse $fr_2$ occurs, the first flip flop supplies an enable signal via conductor 312 to the second flip flop (tune up flip flop) 302 which in conjunction with reference pulse $fr_2$ causes the second flip flop 302 to go low constituting a tune up signal to VTO 260.

Upon receipt of the third reference pulse $fr_3$ or the VMC pulse through summing gate 318, the second flip flop returns to a high condition and terminates its tune-up signal.

It should be noted that the reset signal functions to cause rapid and repeated comparisons to be made between fr and effectively fo while substantial tune up or tune down signals are supplied to the VTO 260 to achieve substantial frequency lock. Once the VMC pulse falls into the window, the reseting ceases while the tuning circuit III proceeds with fine tuning to effect not only frequency lock but phase lock as well. Indeed, since a slight frequency error will initially appear as a phase error which is integrating as cycles occur, it can be seen that the phase locking effected by the tuning circuit III results in nearly perfect frequency and phase lock.

It should also be noted that in a preferred circuit, the reference frequency $fr_2$ is generated at the output of the reference window generator 276 and supplied to the reference divider 288 via conductor 322. The reference frequency $fr_2$ is therein regenerated and referenced to the input 164 to remove jitter caused by processing $fr_1$ through circuit components. As a result, the reference signal $fr_2$ is clean and quiet. In turn, the carrier fo is clean and quiet because f.m. jitter is significantly reduced vastly improving the performance of the carrier generator and the transmitter 152.

It is to be understood that the embodiment herein disclosed is illustrative of the principles of the inventions. Reference herein to details of the illustrated embodiment is not intended to limit the scope of the claims which themselves recite those features regarded as essential to the inventions.

I claim:

1. A frequency and phase locking circuit comprising:
    a voltage tuned oscillator (VTO) having an output and an input;
    a variable modulus counter (VMC) conductively connected to receive the output of said VTO as its first input, and having an output and a second input;
    a first node conductively connected to said VMC output;
    signal position detector means having a first input which is conductively connected to said first node to receive said VMC output, a second input and an output;
    a reference window generator having an output conductively connected to said second input of said signal position detector means;
    a reset generator conductively connected to receive the output of said signal position detector means as its input and supply as its output a reset signal;
    a second node conductively connected to the output of said reset generator and to said second input of said VMC to supply said reset signal thereto;
    a reference divider having a first input conductively connected to an external reference sifgnal and having a second input conductively connected to said second node to receive said reset signal, having a first output conductively connected to said reference window generator to supply a reference signal thereto, and having second and third outputs;
    a tuning circuit having a first input conductively connected to said first node to receive said VMC output, a second input conductively connected to said reference divider to receive said second output of said reference divider and a third input conductively connected to said reference divider to receive said third output of said reference divider, and having an output conductively connected to said input of said VTO to supply a tuning signal thereto; and wherein said reference divider supplies a reference signal to said reference window generator which generates a reference window signal of short duration and supplies it to said signal position detector means, and wherein said VMC receives the output of said VTO and supplies an output which is the quotient of said VTO output divided by an integer, said signal position detection means receiving said VMC output and comparing it with said window signal and sending an output signal which causes said reset generator to supply a reset signal when said VMC output does not occur in time within said window signal, said reset signal resetting said VMC and reference divider to start sending their output signals approximately simultaneously, and wherein said tuning circuit compares in time the arrival of said VMC output with the arrival of the reference signal of said second output of said reference divider and the portion of the reference signal of said third output of said reference divider which is subsequent in time to said second output reference signal to generate a tune up in frequency signal when said VMC output arrives after said second output reference signal and before said third output reference signal and to generate a tune down in frequency signal when said VMC output arrives after said third output reference signal and before said second output reference signal, said tune up and tune down signals being supplied to said VTO input to tune up and tune down, respectively, the frequency of said VTO output.

2. The circuit of claim 1 wherein said tuning circuit includes:

a first flip flop having a first input connected to receive a control voltage, a second input to receive said VMC output, a third input connected to receive said second output of said reference divider, a first output and a second output;

a first tune signal translating means having an input connected to said first output of said first flip flop and an output;

a summing circuit having a first input connected to receive said VMC output, a second input connected to receive said third output of said reference divider, and an output;

a second flip flop having a first input connected to receive the output of said summing circuit, a second input connected to receive said second output of said reference divider, a third input connected to receive the second output of said first flip flop and an output;

a second tune signal translating means having an input connected to receive the output of said second flip flop and an output;

a third node connected to receive the outputs of said first and said second tune signal translating means and connected to said input of said VTO; and wherein the first output of said first flip flop goes high constituting a tune-down signal upon the receipt of a VMC output pulse and goes low upon receipt of a reference signal pulse from said second output of said reference divider, said output remaining low when said reference signal pulse arrives first in time and wherein said output of said second flip flop goes low constituting a tune-up signal upon receipt of a reference signal pulse from said second output of said reference divider and goes high upon receipt of a VMC output pulse and upon receipt of a reference pulse from said third output of said reference divider via said summing circuit.

3. The circuit of claim 2 wherein said first and second tune signal translating means are field effect transistors and wherein said third node is connected to filter means.

* * * * *